United States Patent
Ruppi

(10) Patent No.: US 7,422,803 B2
(45) Date of Patent: Sep. 9, 2008

(54) COATING WITH CONTROLLED GRAIN SIZE AND MORPHOLOGY FOR ENHANCED WEAR RESISTANCE AND TOUGHNESS

(75) Inventor: Sakari Ruppi, Fagarsta (SE)

(73) Assignee: Seco Tools AB, Fagersta (SE)

( * ) Notice: Subject to any disclaimer, the term of this patent is extended or adjusted under 35 U.S.C. 154(b) by 262 days.

(21) Appl. No.: 10/831,169

(22) Filed: Apr. 26, 2004

(65) Prior Publication Data

US 2004/0265541 A1    Dec. 30, 2004

(30) Foreign Application Priority Data

Apr. 24, 2003    (SE) .................................... 0301195

(51) Int. Cl.
*B32B 9/00*    (2006.01)

(52) U.S. Cl. .......................... 428/698; 51/307; 51/309; 428/325; 428/336; 428/697; 428/699

(58) Field of Classification Search .................. 51/307, 51/309; 428/325, 697, 698, 699, 701, 336
See application file for complete search history.

(56) References Cited

U.S. PATENT DOCUMENTS

| | | | |
|---|---|---|---|
| RE31,526 E | | 2/1984 | Smith et al. |
| 4,619,886 A | | 10/1986 | Okutsu |
| 4,753,854 A | * | 6/1988 | Gavrilov et al. ............. 428/698 |
| 5,863,640 A | * | 1/1999 | Ljungberg et al. .......... 428/701 |
| 5,915,162 A | * | 6/1999 | Uchino et al. ............... 428/698 |

(Continued)

FOREIGN PATENT DOCUMENTS

EP    487008    *    5/1992

(Continued)

OTHER PUBLICATIONS

A. Larson and S. Ruppi, Microstructure and properties of Ti(C,N) coatings produced by moderate temmperature chemical vapour deposition, Thin Solid Films, 402, 2002, pp. 203-210.

(Continued)

*Primary Examiner*—Archene Turner
(74) *Attorney, Agent, or Firm*—Drinker Biddle & Reath LLP

(57) ABSTRACT

Wear resistance of the prior-art Ti(C,N) layers can be considerably enhanced by optimising the grain size and microstructure. This invention describes a method to obtain controlled, fine, equiaxed grain morphology in Ti(C,N) layers produced using moderate temperature CVD (MTCVD). The control of the grain size and shape can be obtained by doping using CO, $CO_2$, $ZrCl_4$ and $AlCl_3$ or combinations of these. Doping has to be controlled carefully in order to avoid nanograined structures and oxidisation. This kind of coatings shows new enhanced wear properties. The fine grain size together with equiaxed grain morphology enhances the toughness of the coating with at least maintained wear resistance, which can be seen especially in sticky steels like stainless steels. The optimum grain size is from about 50 to about 300 nm, preferably from about 50 to about 150. The coatings according to this invention are characterised by the lack of any strong preferred growth orientation, the length-to-width ratio (L/W) around 1 and only with a slight to moderate XRD line broadening.

15 Claims, 2 Drawing Sheets

U.S. PATENT DOCUMENTS

| | | | | |
|---|---|---|---|---|
| 5,945,207 | A * | 8/1999 | Kutscher et al. | 428/325 |
| 5,981,049 | A * | 11/1999 | Ohara et al. | 428/699 |
| 5,981,078 | A * | 11/1999 | Tabersky et al. | 428/697 |
| 6,090,476 | A * | 7/2000 | Thysell et al. | 428/698 |
| 6,093,479 | A * | 7/2000 | Yoshimura et al. | 428/699 |
| 6,221,469 | B1 | 4/2001 | Ruppi | |
| 6,284,356 | B1 * | 9/2001 | Kiriyama | 428/699 |
| 6,333,098 | B1 * | 12/2001 | Olsson et al. | 428/697 |
| 6,472,060 | B1 | 10/2002 | Ruppi et al. | |
| 2002/0012818 | A1 | 1/2002 | Ruppi et al. | |

FOREIGN PATENT DOCUMENTS

| | | | |
|---|---|---|---|
| EP | 1 008 673 | A1 | 6/2000 |
| EP | 1 010 775 | B1 | 6/2000 |
| EP | 1 118 688 | A1 | 7/2001 |
| JP | 5-345976 | | 12/1993 |
| JP | 8-132130 | | 5/1996 |
| JP | 08-269719 | * | 10/1996 |
| JP | 09-174304 | * | 8/1997 |

OTHER PUBLICATIONS

European Search Report dated Jul. 18, 2007 in EP Application No. 04 00 9402.

Ruppi et al., "Deposition, microstructure, and properties of nanocrystalline (Ti(C, O, N) coatings", Journal of Vacuum Science and Technology, vol. 21, 21, No. 1, Jan. 2003, pp. 66-75, XP012006295.

* cited by examiner

COATING WITH CONTROLLED GRAIN SIZE AND MORPHOLOGY FOR ENHANCED WEAR RESISTANCE AND TOUGHNESS

BACKGROUND OF THE INVENTION

The present invention relates to a cutting tool inserts consisting of a substrate at least partially coated with a coating consisting of one or more wear resistant layers of which at least one layer is a MTCVD-Ti(C,N)-layer composed of grains with grain size just above the nanograined region with equiaxed grain morphology. As a result the problem with grain boundary sliding at higher temperatures has been reduced and, consequently, wear resistance increased with almost maintained toughness. The inserts are particularly useful in applications where toughness is important, like in milling of adhering sticky stainless steels.

Coated bodies used for metal cutting are well known. Typically, the bodies are made of a cemented carbide, cermet or ceramic and the coatings are one or more of a Group VIB metal carbide, nitride, oxide or mixtures thereof. For example, bodies of cemented carbides coated with layers of TiC, Ti(C,N), $Al_2O_3$ and TiN are widely used. There are many variations in layer composition and thickness. The layers are applied by various methods such as CVD (chemical vapor deposition), both conducted at temperature from about 900 to 1100° C. and MTCVD (medium temperature chemical vapor deposition) conducted at temperatures of from about 700 to about 900° C., and PVD (physical vapor deposition).

CVD TiC coatings are usually composed of equiaxed grains with the grain size being from about 0.5 to about 1.0 microns. CVD TiN as well as MTCVD TiCN coatings are composed of columnar grains with the length of the grains approaching the coating layer thickness, S. Ruppi et al Thin Solid Films 402 (2002) 203. The morphology of CVD coatings can be slightly modified by process adjustments. The MTCVD coatings are, however, very difficult to modify by conventional process adjustments. MTCVD coatings are particularly characterized by the presence of large columnar grains with the length of the crystals approaching the thickness of the coating layer. Ti(C,N) layers produced by using MTCVD are today almost exclusively used instead of CVD TiC or Ti(C,N).

It is well-known that the hardness of polycrystalline materials in general (including coating layers as well) obey the Hall-Petch equation: $H = H° + C/\sqrt{d}$ where H is the hardness of a polycrystalline material, H° is the hardness of a single crystal, C is a material constant (C>0) and d is the grain size. As may be seen from this equation, the hardness of a material can be increased by decreasing the grain size.

This relation is, however, not necessarily correct for hard and brittle materials with limited plasticity. Furthermore, when dealing with nanograined hard materials with extremely fine grain sizes, the fraction of material in grain boundaries is increased and this effect has to be taken into consideration. Consequently, a reverse Hall-Petch dependence has been observed in many studies dealing with nanograined materials. Generally, it is assumed that the relationship is valid for grain sizes down to from about 20 to about 50 nm. At these crystal sizes, mobility and multiplication of dislocations will be severely reduced. The properties of grain boundaries will start to dominate and grain boundary sliding has been suggested to be responsible for the reverse Hall-Petch dependence.

As is clear from U.S. Pat. No. 6,472,060 the crater wear resistance is reduced when the grain size is decreased in to the nanograined region even though the room temperature hardness is increased. This is explained by increased amount of grain-boundary sliding. Consequently, when crater wear resistance is considered there is an optimum grain size and shape for the maximised performance just above the nanograined region. It is emphasised that the optimum grain shape (morphology) is not the same for all work piece materials and cutting conditions. Consequently, both the grain morphology and the grain size should be controlled in order to maximise the performance of the tool. In all applications, however, the grain size should be kept slightly above the nanograined region.

The use of different dopants such as a tetravalent titanium, hafnium and/or zirconium compounds in the formation of an $Al_2O_3$ layer in order to promote the formation of a particular phase is shown in U.S. Reissue Patent 31,526. Also, the use of a dopant selected from the group consisting of sulphur, selenium, tellurium, phosphorous, arsenic, antimony, bismuth and mixtures thereof to increase the growth rate of $Al_2O_3$ applied by CVD as well as to promote even layers of the coating is disclosed in U.S. Pat. No. 4,619,886. Dopants can also be applied to refine the grain size of MTCVD coatings. The use of CO doping to achieve nanograined MTCVD Ti(C, N) layers is disclosed in U.S. Pat. No. 6,472,060.

U.S. Pat. No. 6,472,060 discloses a method where relatively high amounts of CO, from about 5 to about 10%, preferably from about 7 to about 9%, of the total gaseous mixture, are used in MTCVD in order to obtain a grain size of the order of 25 nm or less, preferably 10 nm or less. The CO-doped nanograined MTCVD coatings exhibited increased toughness, however, with reduced crater wear resistance as a consequence. It has recently been confirmed that reduced crater wear resistance is obtained when the grain size of the MTCVD coatings was reduced into the nanograined region, Ruppi et al Thin Solid Films 402 (2002) 203.

It has previously been shown (U.S. Pat. No. 6,472,060) that the grain size of MTCVD coatings can be decreased considerably and brought into the nanograined region. These nanocrystalline layers should preferably be applied as outermost layers. The nanocrystalline coatings are harder but exhibit grain boundary sliding leading to plastic deformation at higher temperatures (at higher cutting speeds).

However, due to the extremely fine grain size of these coatings, the surface smoothness is increased and friction coefficient is reduced. Consequently, nanocrystalline coatings obviously are acting as friction reducing/lubricating layers and should, as mentioned above, be deposited on top of the existing coating structure.

OBJECTS AND SUMMARY OF THE INVENTION

It is an object of this invention to avoid or alleviate the problems of the prior art.

It is further an object of this invention to provide a coating layer of controlled grain size and morphology just above the nanograined region. According to this invention equiaxed grain morphologies with reduced grain sizes can be obtained in a controlled way. These coatings can be used in applications demanding high toughness and edge strength.

In one aspect, there is provided a cutting tool insert consisting of a substrate of cemented carbide, cermet or ceramic at least partially coated with a coating with a total thickness of from about 10 to about 40 μm of one or more wear resistant layers of which at least one layer is a MTCVD-Ti(C,N)-layer with a thickness of from about 3 to about 30 μm, said layer being composed of equiaxed grains with grain size of from about 50 to about 300 nm and having a length-to-width ratio (L/W)<3.

In another aspect, there is provided a method of depositing a MTCVD-Ti(C,N)-layer using known MTCVD-technique, the improvement comprising using a dopant addition in order to obtain a layer composed of equiaxed grains with grain size of from about 50 to about 300 nm and having a length-to-width ratio (L/W) of <3.

The above mentioned coatings can be used in combination with other CVD materials such as alumina to enhance the performance and wear resistance of the prior-art products.

DETAILED DESCRIPTION OF THE PREFERRED EMBODIMENTS OF THE INVENTION

Figure 1:
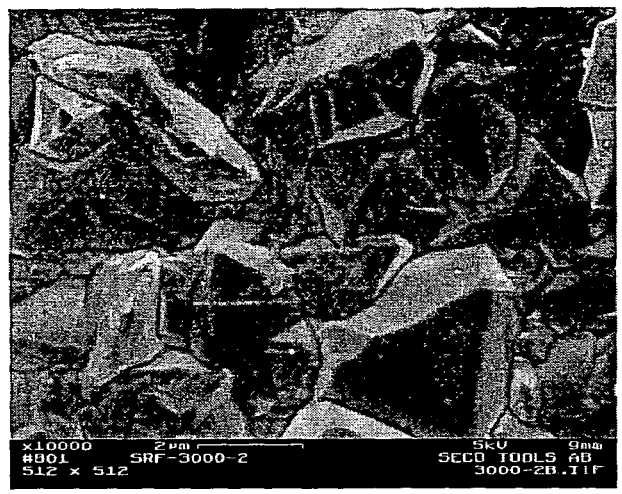
FIG. 1 shows the surface morphology of a MTCVD according to the prior art (SEM) at a magnification of 10000 times.

It has surprisingly been found that equiaxed grain morphology with grain sizes of from about 50 to about 200 nm increased toughness with maintained wear resistance over the prior art MTCVD coatings. In toughness demanding applications like turning and milling of stainless steels, the performance of coatings made according to this invention could exceed the performance of the prior-art MTCVD coatings by from about 80 to about 100%. However, as indicated above it is very important to control the grain size so that it is not brought into the nanograined region. These coatings can be performed in a controlled way by using modern CVD reactors. Deposition can be carried out lower or at the typical MTCVD or CVD temperatures of the order of from about 700 to about 1000° C.

According to the present invention there is provided a cutting tool insert consisting of a substrate at least partially coated with a coating with a total thickness of from about 10 to about 40 μm, preferably from about 15 to about 25 μm, of one or more refractory layers of which at least one layer is a MTCVD-Ti(C,N)-layer with a thickness of from about 3 to about 30 μm, preferably from about 5 to about 20 μm. The grain size nanograined layers is increased to from about 50 to about 300 nm, preferably from about 50 to about 200 nm and most preferably from about 50 to about 150 nm (just above the nanograined region) with the equiaxed grain morphology. The problem with grain boundary sliding at higher temperatures is reduced. Consequently, wear resistance can be increased considerably with toughness maintained almost to that exhibited by the nanograined layers. It has been found that in applications where toughness is important, like in milling of adhering sticky stainless steels, the equiaxed morphology is superior to columnar one. A typical example of this kind of situation is milling of stainless steels, where toughness is very important.

The equiaxed grain morphology can be obtained by using CO doping in the range of from about 1.5 to about 4%, preferably from about 2 to about 3%. At levels exceeding from about 5.0%, nanograined layers will be obtained (US 20020012818). $CO_2$ doping of 0.1 to 0.8% can also be used to obtain the above specified structures. It has also been found that the equiaxed morphology can be obtained by adding $ZrCl_4$ or $HfCl_4$, preferably together with CO. In order to obtain equiaxed grain morphology $ZrCl_4$ and $HfCl_4$ should be added in the range of from about 1.0 to about 5%, preferably from about 1.5 to about 2.5%. When applied simultaneously with CO, lower amounts of $ZrCl_4$ and $HfCl_4$ are needed. An $AlCl_3$ addition of from about 1.0 to about 6.0%, preferably from about 2.5 to about 5.5% together with CO can also be used for the same purpose. In all cases it is important that the grain size of the equiaxed grains should be according to the above mentioned in diameter and simultaneously care should be taken not to reach the nanograined region with lower wear resistance as a consequence.

With a mixture of $CO/CO_2$ together with $AlCl_3$ small amounts of aluminium can be introduced in the layers. Further, $ZrCl_4$, $HfCl_4$, $AlCl_3$ and $CO/CO_2$ can all be applied simultaneously. In these cases the amount of $CO_2$ dopant should be from about 0.1 to about 0.6%, preferably from about 0.2 to about 0.4. The $CO/CO_2$ ratio should be higher than 2, preferably higher than 4 and if possible from about 5. The amount of $AlCl_3$ should be from about 1 to about 6%, preferably from about 2.5 to about 5.5%.

The said dopants can be added at anytime throughout the deposition process, continuously or in the interrupted mode. When $CO_2$ and/or $CO/CO_2$ mixtures are used, care should be taken within the skill of the artisan to avoid the formation of Magnelli phases.

In Table 1 the effects of the additions of $ZrCl_4$, $HfCl_4$, $AlCl_3$, CO or $CO_2$ dopants in the $TiCl_4$—$CH_3CN$—$N_2$—$H_2$ system are depicted. The coatings were deposited at the temperature of 880° C. This process is generally referred to as MTCVD. The process can be carried out at from about 800 to about 1000° C., preferably from about 800 to about 900° C.

TABLE 1

| | CO | $CO_2$ | $AlCl_3$ | $ZrCl_4$ | $HfCl_4$ |
|---|---|---|---|---|---|
| Columnar | 0.1–1.0% | — | — | — | — |
| Columnar | 0.1–1.0% | — | 1.0–2.0% | — | — |
| Columnar | — | — | — | 0.1–0.5% | — |
| Columnar | 0.1–1.0% | — | — | 0.1–0.5% | — |
| Columnar | — | — | 1.0–2.0% | 0.1–0.5% | — |
| Columnar | 0.1–1% | — | 1.0–2.0% | 0.1–0.5% | — |
| Columnar | — | — | — | — | 0.1–0.5% |
| Columnar | 0.1–1.0% | — | — | — | 0.1–0.5% |
| Equiaxed | 1.5–4.0% | — | — | — | — |
| Equiaxed | — | 0.01–0.08% | — | — | — |
| Equiaxed | — | — | — | 1.5–5.0% | — |
| Equiaxed | 1.5–4.0 | — | 2.5–5.5% | — | — |
| Equiaxed | 1.5–4.0% | 0.1–0.4 | 2.5–5.5% | — | — |
| Equiaxed | 0.5–4.0% | — | — | 1.5–3.5% | — |
| Equiaxed | 0.5–4.0% | 0.1–0.4 | 2.5–5.5% | 1.5–3.5% | — |
| Equiaxed | 0.5–4.0% | — | — | — | 0.1–3.5% |
| Equiaxed | 0.5–4.0% | 0.1–0.4 | — | — | 0.1–3.5% |

By equiaxed, it is meant that the grains have essentially the same dimension in all directions.

According to this invention it has proved out to be possible to control and obtain an uniform grain size in a coating layer independent on the total thickness of the said coating layer. As clear for example from U.S. Pat. No. 6,221,469 the grain size in prior art is a function of the coating thickness.

The present invention also relates the cutting performance with the growth texture. The growth texture can be described by texture coefficients (TC), which are determined as follows:

$$TC(hkl) = \frac{I(hkl)}{I_o(hkl)} \left\{ \frac{1}{n} \sum \frac{I(hkl)}{I_o(hkl)} \right\}^{-1}$$

where
I(hkl)=intensity of the (hkl) reflection
$I_0$(hkl)=standard intensity according to JCPDS card no 42-1489
n=number of reflections used in the calculation
(hkl) reflections used are: (111), (200), (220), (311), (222), (400), (331), (420), (422), (511).

The fact that there are no strong preferred growth orientations in the coating according to this invention is manifested by the texture coefficient (TC).

The texture coefficient for all the coatings according to this invention should be as follows: The texture coefficient for the (111), (200), (220), (311), (222), (400), (331), (420), (422) and (511) reflections should be less then 6, preferably less than 5 and most preferably less than 4.

Further, the line broadening of 220 reflection should be less than 2.25, preferably less than 2.0, most preferably less than 1.7, expressed as a relative value, the reference being non-doped prior-art Ti(C,N). Line broadening is defined as $B_n/B_0$, where $B_0$ is the Full Width at Half Maximum (FWHM) of the reference reflection and $B_n$ is the Full Width at Half Maximum (FWHM) of the corresponding reflection of the coating according to this invention. Both are measured from $K_{\alpha2}$-stripped Gaussian profiles of 220 reflection. Expressed in absolute values, the Full Width at Half Maximum (FWHM) should be less than 0.4°, preferably less than 0.35° and most preferably less than 0.30°.

Line broadening is also a useful means to control that the produced layer has not been brought into the nanograined region manifested by line broadening $B_n/B_0$ clearly exceeding 2.25.

The preferred grain morphology can be expressed by the length-to-width ratio (L/W), which should be: $1 \leq (L/W) < 3$, preferably $1 \leq (L/W) < 2$ and most preferably about 1.

Chemical compositions of the obtained layers can be described by the following formula $(Ti_xAl_yX_z)(C_uO_wN_v)$, where x, u and v>0 and at least one of y, z and w>0. The compositions of the layers according to this invention should be varied in the following limits: x is from about 0.3 to about 0.8, y is from about 0.0 to about 0.2, z is from about 0.0 to about 0.2, u is from about 0.3 to about 0.9, w is from about 0.0 to about 0.2 and v is from about 0.3 to about 0.6. In the formula $(Ti_xAl_yX_z)(C_uO_wN_v)$ X can be selected from groups 4 to 6. The useful elements are Zr, Hf, Nb, Ta or Mo even though Zr and Hf are used preferably.

The substrate comprises a hard material such as cemented carbide, cermets, ceramics, high speed steel or a superhard material such as cubic boron nitride (CBN) or diamond preferably cemented carbide or CBN. With CBN is herein meant a cutting tool material containing at least 40 vol-% CBN. In a preferred embodiment the substrate is a cemented carbide with or without a binder phase enriched surface zone.

Cemented carbide cutting inserts with a composition of 6.0% Co and balance WC (hardness about 1580 HV) were used as substrates in all Examples. The following geometries were used in the cutting tests: SNUN120408 and CNMG120408 M3.

The invention is additionally illustrated in connection with the following Examples, which are to be considered as illustrative of the present invention. It should be understood, however, that the invention is not limited to the specific details of the Examples.

EXAMPLE 1

This example demonstrates the effect of CO doping. CO doping was applied to obtain columnar and equiaxed structures with reduced and controlled grain sizes. The following four experimental coatings (referred to as coatings 1, 2, 3 and 4) were produced at a pressure of 70 m bar and at a temperature of 880° C. according to the process data given in Table 2. Compared with the U.S. Pat. No. 6,472,060, considerably lower amounts of doping were used except coating 4, which was produced according to prior art (U.S. Pat. No. 6,472,060). Coating 2 is deposited at a CO level of 0.8% and is composed of fine-grained columnar crystals. Coating 3 was deposited at CO doping level of 2.5% and is composed of equiaxed grains. In order to obtain equiaxed grain morphology above the nanograined region CO doping in the range of from about 2.0 to about 4.0%, preferably from about 2 to about 3% of the total gas flow can be used. The CO addition had to be controlled carefully so that the nanograined layers are not obtained. Coating 4 was deposited using 8% CO according to U.S. Pat. No. 6,472,060 to obtain nanograined layer. Coating 1 was deposited according to prior art without any dopant additions and is an example of a typical structure of a MTCVD coating.

TABLE 2

|  | $H_2$ (1/min) | $N_2$ (1/min) | $CH_3CN$ (1/min) | $TiCl_4$ (1/min) | $ZrCl_4$ (%) | $AlCl_3$(%) | $CO_2$(%) | CO(%) |
| --- | --- | --- | --- | --- | --- | --- | --- | --- |
| Coating 1 | Balance | 45.5 | 0.55 | 2.1 | 0.0 | 0.0 | 0.0 | 0.0 |
| Coating 2 | Balance | 45.5 | 0.55 | 2.1 | 0.0 | 0.0 | 0.0 | 0.8 |
| Coating 3 | balance | 45.5 | 0.55 | 2.1 | 0.0 | 0.0 | 0.0 | 2.5 |
| Coating 4 | balance | 45.5 | 0.55 | 2.1 | 0.0 | 0.0 | 0.0 | 8.0 |

EXAMPLE 2

Figure 2:
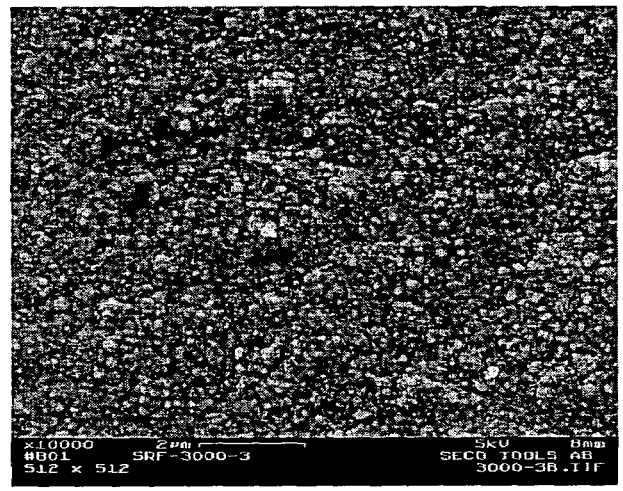
FIG. 2 shows the surface morphology of a modified MTCVD coating according to this invention (SEM) at a magnification of 10000 times.

The coatings were investigated using Transmission electron microscopy (TEM) and Scanning electron microscopy (SEM) in order to elucidate the effect of CO doping on the grain size and morphology. It appeared clear even in SEM that the microstructure of the typical MTCVD Ti(C,N) coating being composed of large columnar crystals (FIG. 1) can be refined by CO doping. The equiaxed grain morphology was obtained at CO doping level of from about 2.5% (FIG. 2).

TEM revealed that at this CO level the grain size was not brought into the nanograined region and was about 60 nm. The grain size of Coating 4 deposited according to prior-art was in the nanograined region. The results are summarized in Table 3.

TABLE 3

|  | Grain size*) | Morphology |
| --- | --- | --- |
| Coating 1 | 1500 × 4000 nm | Large columnar |
| Coating 2 | 90 × 650 nm | Needle-like |
| Coating 3 | 60 nm | Small-equiaxed |
| Coating 4 | 14 nm | Nanograined |

EXAMPLE 3

This example demonstrates the deposition of equiaxed grain morphology with controlled grain sizes. The effects of $ZrCl_4$ and $AlCl_3$ on the grain size and morphology with and without $CO/CO_2$ doping are demonstrated.

TABLE 4

|  | $H_2$ (l/min) | $N_2$ (l/min) | $CH_3CN$ (l/min) | $TiCl_4$ (l/min) | $ZrCl_4$ (%) | $AlCl_3$(%) | $CO_2$(%) | CO(%) |
| --- | --- | --- | --- | --- | --- | --- | --- | --- |
| Coating 5 | balance | 45.5 | 0.55 | 2.1 | 2.5 | 0.0 | 0.0 | 0.0 |
| Coating 6 | balance | 45.5 | 0.55 | 2.1 | 0.7 | 0.0 | 0.0 | 2.1 |
| Coating 7 | balance | 45.5 | 0.55 | 2.1 | 0.0 | 1.5 | 0.0 | 3.0 |
| Coating 8 | balance | 45.5 | 0.55 | 2.1 | 0.0 | 3.0 | 0.2 | 3.0 |
| Coating 9 | balance | 45.5 | 0.55 | 2.1 | 2.5 | 0.0 | 0.2 | 3.0 |
| Coating 10 | balance | 45.5 | 0.55 | 2.1 | 2.5 | 3.0 | 0.2 | 3.0 |

Figure 3:
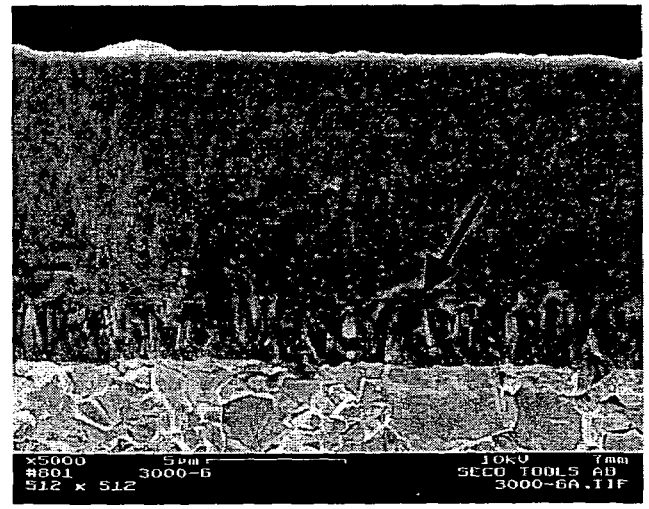
FIG. 3 shows the effect of a $ZrCl_4$ doping on the grain size (cross-section SEM) at a magnification of 5000 times. The arrow indicates the abrupt change in the coating structure when $ZrCl_4$ is introduced into the furnace.

The structure of coating 5 is shown in FIG. 3. The first part (about 2 um) was deposited without $ZrCl_4$ doping. As very clear from the FIG. 4 the addition of 2.5% of $ZrCl_4$ changed the coating morphology from columnar to equiaxed one (arrowed). Lower additions of $ZrCl_4$ are needed to obtain the same structure as in Coating 5, if $ZrCl_4$ is applied simultaneously with CO (coating 6). The same type of behavior could be obtained by adding $AlCl_3$ together with CO (coating 7). $HfCl_4$ behaves in the similar way as $ZrCl_4$. Consequently, $ZrCl_4$ can be substituted by $HfCl_4$ and added together with CO, $CO_2$ and/or $AlCl_3$.

The coatings (Coatings 6 and 7) showed only traces of Zr or Al. With additions of small amounts of $CO_2$ into the gas mixture, higher amounts of Al or Zr, from about 2 to about 5 wt % could be introduced in the coatings with the equiaxed morphology in sub-micron scale maintained (Coatings from about 8 to about 10). Coating 10 was deposited using $AlCl_3$ and $ZrCl_4$ doping simultaneously with $CO/CO_2$ doping. Both Al and Zr could be detected in this coating.

EXAMPLE 4

TEM was used to determine the grain size of Coatings from about 5 to about 10. In addition of morphology also the coating compositions were studied using energy disperse and EDS and WDS. The measured grain sizes are presented in Table 5.

TABLE 5

|  | Grain size*) | Morphology | Analyses |
| --- | --- | --- | --- |
| Coating 5 | 60 | Equiaxed | 2.4 wt % Zr |
| Coating 6 | 45 | Equiaxed | 1.6 wt % Zr |
| Coating 7 | 65 | Equiaxed | 0.6 wt % Al |
| Coating 8 | 65 | Equiaxed | 3.9 wt % Al |
| Coating 9 | 45 | Equiaxed | 3.2 wt % Zr |
| Coating 10 | 75 | Equiaxed | 3.2 wt % Zr; 2.9 wt % Al |

*)Measured by TEM

EXAMPLE 5

Coatings 1, 3, 4 and 6 were studied by using XRD. Grain refinement is only slightly manifested as line broadening. It is clearly demonstrated that the coatings according to this invention are not in the nanograined region, Table 6.

TABLE 6

|  |  | Line broadening |  |  |
| --- | --- | --- | --- | --- |
| CO % | FWHM* (°2θ) | ($B_n/B_o$) | Grain Shape |
| Coating 1 | 0.149 ($B_o$) | 1.00 | Large columnar |
| Coating 3 | 0.224 ($B_{n3}$) | 1.50 | Small equiaxed |
| Coating 4 | 3.358 ($B_{n4}$) | 2.40 | Nanograined |
| Coating 6 | 0.253 ($B_{n6}$) | 1.70 | Small equiaxed |

*Full Width at Half Maximum. Measured from $K_{\alpha 2}$-stripped Gaussian profiles of 220 reflection.
Full Width at Half Maximum of the reference is $B_o$.
Full Width at Half Maximum of experimental coating is $B_{n_{coating}}$

EXAMPLE 6

Figure 4:
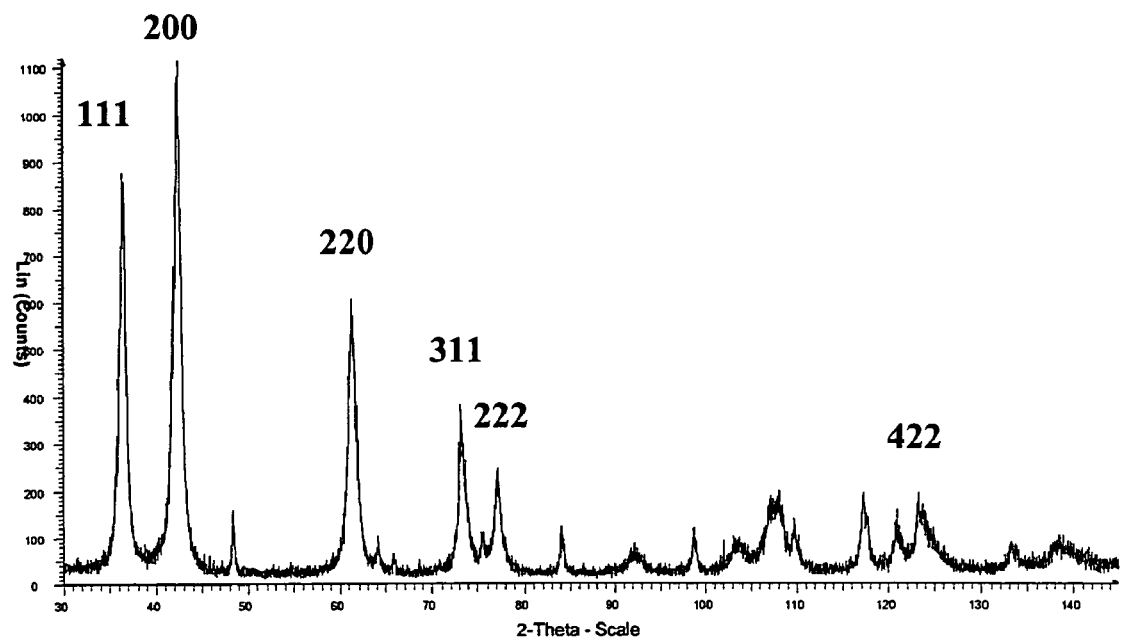
FIG. 4 shows a typical X-ray diffraction pattern of a coating according to this invention being composed of fine, equiaxed grains.
Figure 5:
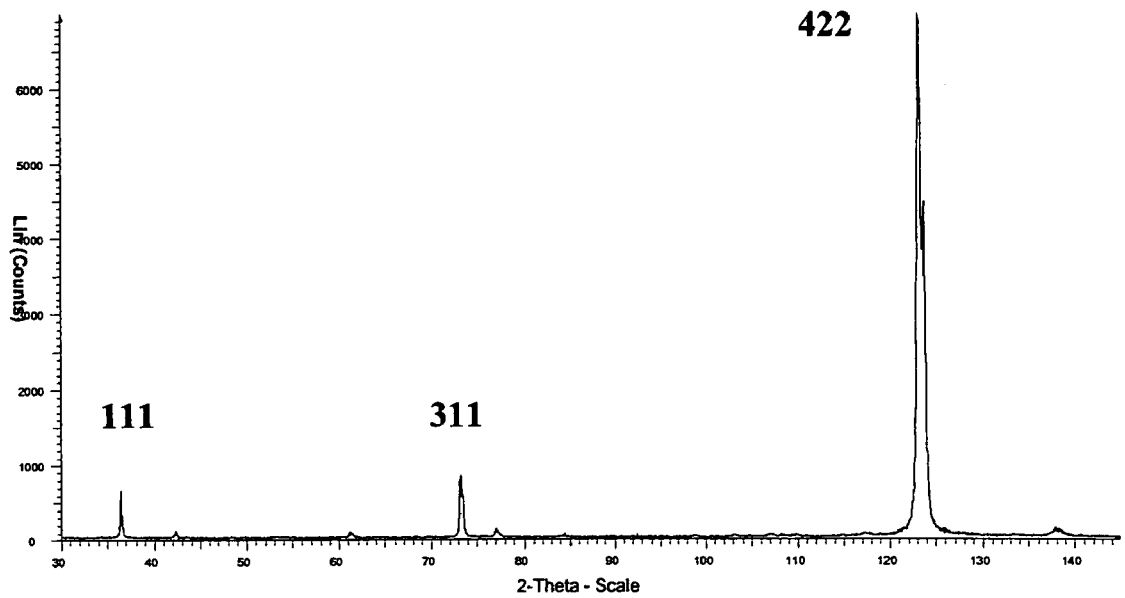
FIG. 5 shows a typical X-ray diffraction pattern of a coating composed of fine, columnar grains.

Typical X-ray diffraction patterns originating from Coating 3 (Example 1) and Coating 2 (Example 1) are shown in FIGS. 4 and 5, respectively. Coating 3 was deposited according to this invention and is composed of small equiaxed grains. Coating 2 is composed of small columnar grains. The differences are clear. Note especially the behavior of the 422 reflection.

EXAMPLE 7

The coatings 1, 2 and 3 (coating 3 is according to this invention) were studied using XRD. The texture coefficients were determined according to the following.

$$TC(hkl) = \frac{I(hkl)}{I_o(hkl)} \left\{ \frac{1}{n} \sum \frac{I(hkl)}{I_o(hkl)} \right\}^{-1}$$

where

I(hkl)=intensity of the (hkl) reflection $I_o$(hkl)=standard intensity according to JCPDS card no 42-1489 n=number of reflections used in the calculation (hkl) reflections used are: (111), (200), (220), (311), (222), (331), (420), (422) and (511).

The results are given in Table 7.

TABLE 7

| (h, k, l) | Coating 1*) | Coating 2 | Coating 3 |
|---|---|---|---|
| 111 | 1.50 | 0.02 | 0.69 |
| 200 | 0.05 | 0.00 | 0.54 |
| 220 | 0.09 | 0.10 | 0.61 |
| 311 | 0.21 | 0.05 | 0.72 |
| 222 | 0.89 | 0.01 | 0.94 |
| 400 | 0.03 | 0.01 | 0.36 |
| 331 | 1.70 | 0.04 | 1.93 |
| 420 | 0.73 | 0.05 | 1.59 |
| 422 | 3.77 | 9.60 | 1.78 |
| 511 | 1.04 | 0.11 | 0.84 |

*)Prior art

EXAMPLE 8

The experimental coatings were tested in turning of stainless steel under the following conditions:

| | |
|---|---|
| Work piece: | Cylindrical bar |
| Material: | SS2333 |
| Insert type: | SNUN120418 |
| Cutting speed: | 185 and 250 m/min |
| Feed: | 0.5 mm/rev |
| Depth of cut: | 2.5 mm |
| Remarks: | Dry turning |

In this application, the fine-grained equiaxed coatings according to this invention were all superior to columnar coatings. The coating containing aluminium or zirconium or both were the best ones.

TABLE 8

Turning Stainless Steel (SS 2333)

| | Life time (min) at 185 m/min | Life time (min) at 250 m/min |
|---|---|---|
| Coating 1 | 5 | 3 |
| Coating 2 | 6 | 4 |
| Coating 3*) | 9 | 7 |
| Coating 5*) | 9 | 6 |
| Coating 6*) | 9 | 7 |
| Coating 7*) | 9 | 6 |
| Coating 8*) | 9 | 7 |
| Coating 9*) | 13 | 9 |
| Coating 10*) | 13 | 9 |

*)According to this invention Lifetime criterion: according to ISO 3685

EXAMPLE 9

The coatings were compared in face milling of stainless steel. The following parameters were used:

| | |
|---|---|
| Cutting speed: | 175 m/min |
| Feed: | 0.2 mm/tooth |
| Depth of cut: | 2.5 mm |

The cutting edges were investigated after milling of 3400 mm, except the nanograined coating, which failed earlier.

This application clearly demonstrates the increased toughness of the coatings according to this invention.

TABLE 10

Face milling (SS 2333)

| | Cutting Length (mm) | Chipping % |
|---|---|---|
| Coating 1 | 3400 | 16 |
| Coating 2 | 3400 | 14 |
| Coating 3 | 3400 | 9 |
| Coating 4 | 2400 | —*) |
| Coating 5 | 3400 | 6 |
| Coating 6 | 3400 | 6 |
| Coating 7 | 3400 | 9 |
| Coating 8 | 3400 | 10 |
| Coating 9 | 3400 | 8 |
| Coating 10 | 3400 | 8 |

*)Failure due to plastic deformation

The principles, preferred embodiments, and modes of operation of the present invention have been described in the foregoing specification. The invention, which is intended to be protected herein, however, is not to be construed as limited to the particular forms disclosed, since these are to be regarded as illustrative rather than restrictive. Variations and changes may be made by those skilled in the art without departing from the spirit of the invention.

The invention claimed is:

1. Cutting tool insert comprising a substrate of cemented carbide, cermet or ceramic at least partially coated with a coating with a total thickness of from about 10 to about 40 μm of one or more wear resistant layers of which at least one layer is a MTCVD-Ti(C,N)-layer with a thickness of from about 3 to about 30 μm, said layer being composed of equiaxed grains with grain size of from about 50 to about 300 nm and having a length-to-width ratio (L/W)<3, said layer having the following composition expressed as $(Ti_xAl_yX_z)(C_uO_wN_v)$: x is from about 0.3 to about 0.8, y is from about 0.0 to about 0.2, z is from about 0.0 to about 0.2, u is from about 0.3 to about 0.9, w is from about 0.0 to 0.2 and v is from about 0.3 to about 0.6, X being selected of metals from groups 4 to 6, and exhibits, expressed in absolute values, a Full Width at Half Maximum (FWHM) of the 220 reflection of less than 0.4° measured using CuKα-radiation, and where at least one of y, z, and w is greater than zero.

2. The cutting tool insert of claim 1 wherein said coating has a total thickness of from about 15 to about 25 μm of one or more wear resistant layers of which at least one layer is a MTCVD-Ti(C,N)-layer with a thickness of from about 5 to about 20 μm, said layer being composed of equiaxed grains with grain size of from about 50 to about 200 nm and having a length-to-width ratio(L/W) to about 1.

3. The cutting tool insert of claim 1 wherein said at least one layer has texture coefficients of $TC(h,k,l) < 5.$ (h,k,l)=(111), (200), (220), (311), (222), (400), (331), (420), (422) and (511), the texture coefficient TC(hkl) being defined as $$TC(hkl) = \frac{I(hkl)}{I_o(hkl)} \left\{ \frac{1}{n} \sum \frac{I(hkl)}{I_o(hkl)} \right\}^{-1}$$

where I(hkl)=measured intensity of the (hkl) reflection $I_o$(hkl)=standard intensity according to JCPDS card no 42-1489 n=number of reflections used in the calculation (hkl) reflections used are: (111), (200), (220), (311), (222), (400), (331), (420), (422) and (511).

4. The cutting tool insert of claim 3 wherein said layer has texture coefficients of TC(h,k,l)<4.

5. The cutting tool insert of claim 1 wherein said wear resistant layer exhibits, expressed in absolute values, a Full Width at Half Maximum (FWHM) of the 220 reflection of less than 0.35° measured using CuKα-radiation.

6. The cutting tool insert of claim 1 wherein said $(Ti_xAl_yX_z)(C_uO_wN_v)$ layer has the composition X being selected of metals from group Zr or Hf.

7. The cutting tool insert of claim wherein said layer is applied onto an $\alpha$-$A_2O_3$, $\kappa Al_2O_3$, or $\gamma$-$Al_2O_3$ layer which itself has been deposited on top the said substrate.

8. The cutting tool insert of claim 1, wherein x is selected from the group consisting of Zr, Hf, Nb, Ta or Mo.

9. The cutting tool insert of claim 8, wherein x is Zr or Hf.

10. The cutting tool insert of claim 1, wherein the length to width ratio is greater than or equal to 1 and is less than 2.

11. A cutting tool insert comprising a substrate of cemented carbide, cermet or ceramic at least partially coated with a coating of $(Ti_xAl_yX_z)(C_uO_wN_v)$ where x is from about 0.3 to about 0.8, y is from about 0.0 to about 0.2, z is from about 0.0 to about 0.2, u is from about 0.3 to about 0.9, w is from about 0.0 to 0.2, v is from about 0.3 to about 0.6 and x is selected from groups 4 to 6, said layer being from about 3 to about 30 μm, the improvement comprising said layer comprising equiaxed grains having a grain size of from about 50 to about 300 nm and a length to width ratio <3 made by MTCVD, and wherein at least one of y, z, and w is greater than zero.

12. In the cutting tool insert of claim 11 where said coating is Ti(C,N).

13. In the cutting tool insert of claim 11, wherein x is selected from the group consisting of Zr, Hf, Nb, Ta or Mo.

14. In the cutting tool insert of claim 13, wherein x is Zr or Hf.

15. In the cutting tool insert of claim 11, wherein the length to width ratio is greater than or equal to 1 and is less than 2.

* * * * *